(12) United States Patent
Cram

(10) Patent No.: US 6,462,575 B1
(45) Date of Patent: Oct. 8, 2002

(54) METHOD AND SYSTEM FOR WAFER LEVEL TESTING AND BURNING-IN SEMICONDUCTOR COMPONENTS

(75) Inventor: Daniel P. Cram, Boise, ID (US)

(73) Assignee: Micron Technology, Inc., Boise, ID (US)

(*) Notice: Subject to any disclaimer, the term of this patent is extended or adjusted under 35 U.S.C. 154(b) by 10 days.

(21) Appl. No.: 09/650,342

(22) Filed: Aug. 28, 2000

(51) Int. Cl.$^7$ .................. G01R 31/28; G01R 1/073
(52) U.S. Cl. ........................ 324/765; 324/754
(58) Field of Search ................. 324/765, 754, 324/755, 757, 537

(56) References Cited

U.S. PATENT DOCUMENTS

| | | | |
|---|---|---|---|
| 4,961,053 A | * 10/1990 | Krug ..................... 324/537 |
| 5,241,266 A | * 8/1993 | Ahmad et al. ............ 714/733 |
| 5,347,159 A | 9/1994 | Khandros et al. |
| 5,476,211 A | 12/1995 | Khandros |
| 5,495,667 A | 3/1996 | Farnworth et al. |
| 5,682,061 A | 10/1997 | Khandros et al. |
| 5,685,885 A | 11/1997 | Khandros et al. |
| 5,701,666 A | * 12/1997 | De Haven et al. ........ 324/754 |
| 5,796,264 A | 8/1998 | Farnworth et al. |
| 5,844,419 A | 12/1998 | Akram et al. |
| 5,917,707 A | * 6/1999 | Khandros et al. ........ 361/776 |
| 5,949,242 A | 7/1999 | Wood et al. |
| 5,966,022 A | 10/1999 | Budnaitis et al. |
| 5,974,662 A | 11/1999 | Eldridge et al. |
| 6,023,103 A | 2/2000 | Chang et al. |
| 6,032,356 A | 3/2000 | Eldridge et al. |
| 6,043,563 A | 3/2000 | Eldridge et al. |
| 6,046,600 A | 4/2000 | Whetsel |
| 6,049,215 A | 4/2000 | Agahdel et al. |
| 6,046,213 A | 5/2000 | Khandros et al. |

* cited by examiner

Primary Examiner—Ernest Karlsen
(74) Attorney, Agent, or Firm—Stephen A. Gratton

(57) ABSTRACT

A method for testing and burning-in semiconductor components such as semiconductor dice on a semiconductor wafer, is provided. The method includes the step of providing all of the components on the wafer with resilient contact structures, such as metal pins having integral spring segments. The resilient contact structures are used to test the components to identify functional and non-functional components. Following this test, the resilient contact structures on the non-functional components are deformed, such that electrical communication with the non-functional components is prevented in a subsequent burn-in test. This permits the burn-in test to be performed using "shared resources" test equipment. A deformation apparatus for deforming the resilient contact structures includes a deformation block configured to compress, bend or shape the resilient contact structures on the non-functional dice. A test system for performing the burn-in test includes the deformation apparatus, a burn-in board for retaining multiple substrates, a test board having test pads for electrically engaging the resilient contact structures on the functional components, and a test circuitry in electrical communication with the test board. An alternate embodiment test system includes a deformation apparatus configured to electrically engage the resilient contact structures, and to apply test signals to the components to identify defective components.

25 Claims, 8 Drawing Sheets

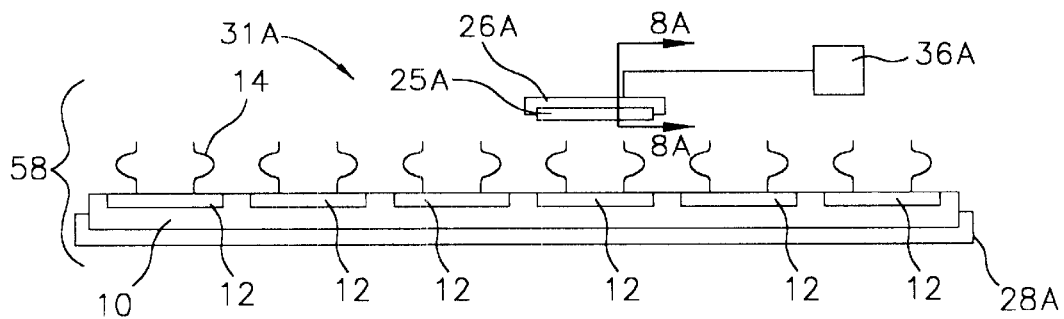
FIGURE 8
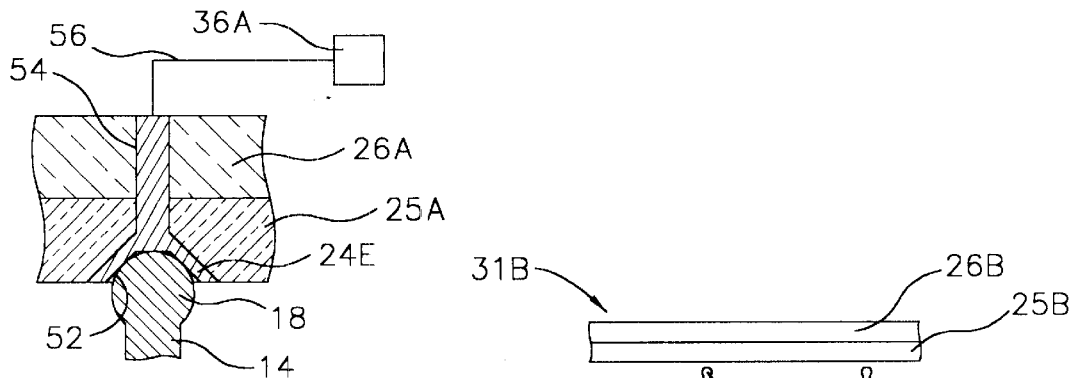
FIGURE 8A
FIGURE 9A
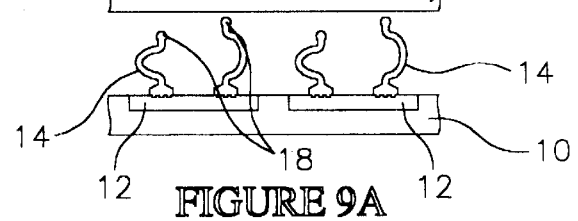
FIGURE 9B
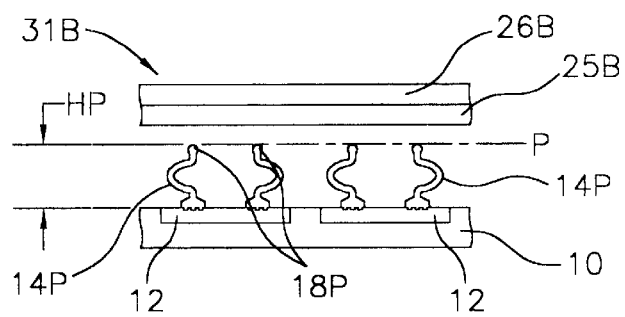
FIGURE 9C

METHOD AND SYSTEM FOR WAFER LEVEL TESTING AND BURNING-IN SEMICONDUCTOR COMPONENTS

FIELD OF THE INVENTION

This invention relates generally to the testing of semiconductor components, and more particularly to the testing and burning-in of semiconductor components contained on a substrate, such as a semiconductor wafer.

BACKGROUND OF THE INVENTION

Semiconductor components such as semiconductor dice and packages are routinely tested during manufacture. Semiconductor dice, for example, are typically fabricated on a semiconductor wafer using well known processes such as doping, masking, etching, and deposition of metals. Following fabrication of the dice, the wafer is probed and mapped to test the gross functionality of each die. A wafer prober and probe card can be used to electrically engage bond pads, or other test pads on the dice, and to apply test signals to the integrated circuits contained on the dice. The non functional dice are mapped in software or mechanically marked.

Following wafer probe, the functional dice can be singulated and packaged, or alternately retained in unpackaged form as known good die (KGD). Packaged dice are then burn-in tested by heating the dice while electrically biasing the integrated circuits on the dice. Bare dice can be burn-in tested using temporary carriers configured to temporarily package the dice. Burn-in boards are adapted to hold a large number of semiconductor packages, or temporary carriers for bare dice, in a chamber with temperature cycling capability. The burn-in boards are also in electrical communication with test circuitry configured to generate and to apply test signals to the dice.

In addition to burn-in testing, full functionality test can be performed on the packaged or bare dice to evaluate various electrical characteristics of the integrated circuits. Among the parameters that can be tested are input and output voltages, capacitance, pad leakage and current specifications. Memory devices can also be subjected to logic tests wherein data storage, retrieval capabilities, and response times are measured.

Recently, different processes have been developed for performing wafer level burn-in testing, prior to the dice being singulated from the wafer. One such process is described in U.S. Pat. Nos. 5,829,128 and 6,032,356 to Eldridge et al., which are assigned to FormFactor Inc. of Livermore, Calif. This process involves probe testing the wafer to identify functional and non-functional dice, and then attaching resilient contact structures to the bond pads on the functional dice. The resilient contact structures can then be used to establish temporary electrical connections with the dice for performing burn-in tests. In addition, the resilient contact structures can be used to provide terminal contacts for the dice following singulation from the wafer.

FIG. 1 illustrates the prior art process sequence of fabricating the dice on the wafer, probe testing to identify functional dice, attaching resilient contact structures to the functional dice, and then burn-in testing the functional dice on the wafer using the resilient contact structures.

FIG. 2A illustrates a prior art semiconductor wafer 10 which comprises a plurality of semiconductor dice 12 having resilient contact structures 14 attached to bond pads 16 (FIG. 2C) of the dice 12. The resilient contact structures 14 have been attached to the functional dice 12F on the wafer 10 responsive to wafer probe testing. As shown in FIG. 2B, each functional die 12F includes the resilient contact structures 14, while each non-functional (defective) die 12NF does not include the resilient contact structures 14. FIG. 2C illustrates the resilient contact structures 14 attached to the bond pads 16 on a functional die 12F. In addition, the resilient contact structures 14 include a core 18 which comprises a relatively low yield strength metal, and a shell which comprises a relatively high yield strength metal. Both the core 18 and the shell 20 are formed with a resilient spring shape or spring segment.

FIGS. 3A–3F illustrate various prior art configurations for the resilient contact structures 14. In FIG. 3A, a resilient contact structure 14A comprises a cantilever beam oriented at an angle to a contact force F. The contact force F can be applied during formation of a pressure or bonded contact with a mating electronic component, such as a printed circuit board (PCB). In FIG. 3B, a resilient contact structure 14B includes an S-shape spring segment configured for contact by the contact force F or a contact force F. In FIG. 3C, a resilient contact structure 14C includes a U-shape spring segment configured for contact by the contact force F. In FIG. 3D, a resilient contact structure 14D includes a curved spring segment configured for contact by the contact force F. In FIG. 3E, a resilient contact structure 14E includes a C-shaped spring segment configured for contact by the contact force F. In FIG. 3F, a resilient contact structure 14F includes a spring segment configured for contact by the contact force F.

One shortcoming of the above wafer level burn-in process is that the wafer 10 must first be probe tested, and the resilient contact structures 14 attached to only the functional dice 12F. In general, the non-functional dice 12NF do not include the resilient contact structures 14 because their electrical connection to the burn-in board may compromise the burn-in test procedure. Specifically, conventional burn-in boards include a power grid for establishing temporary electrical connections to multiple dice at one time. The burn-in boards thus utilize "shared resources" to test a large number of dice at the same time. Non-functional dice 12NF can short the test signals, or otherwise adversely affect the test procedure.

In view of the foregoing, it would be desirable to have a method and system for electrically isolating resilient contact structures 14 on some of the dice 12, particularly the non functional dice 12NF. This would permit all of the dice 12 on the wafer 10 to be provided with resilient contact structures 14, such that wafer probe testing can be performed using the resilient contact structures 14. In addition, this would permit non-functional dice 12NF to be electrically isolated on a burn-in board, to permit wafer level burn-in tests to be performed.

SUMMARY OF THE INVENTION

In accordance with the present invention, a test method, and a test system, for testing and burning-in semiconductor components on a substrate are provided. In an illustrative embodiment the substrate comprises a semiconductor wafer, and the components comprise semiconductor dice fabricated on the wafer.

The test method includes the initial step of providing resilient contact structures on every component constructed as previously described. The test method also includes the step of testing the components to identify functional, and non functional (defective) components. The testing step can be performed using a wafer prober having a test board configured to electrically engage the resilient contact structures. The test method also includes the steps deforming the resilient contact structures on the non functional components to provide deformed contact structures, and then burn-in testing the functional components. The deformed contact structures on the non functional components provide electrical isolation during burn-in testing, such that burn-in can be performed using a burn-in board and test circuitry that employ "shared resources".

Deformation of the resilient contact structures can be performed using a deformation apparatus constructed in accordance with the invention. The deformation apparatus includes a deformation block having a plurality of retention structures for physically engaging the resilient contact structures on the non functional components, and a substrate holder for holding the substrate proximate to the deformation block. Either the deformation block or the substrate holder (or both) can be configured for movement in X, Y and Z directions such that the resilient contact structures on the non functional components can be deformed by compression, bending or shaping. Movement of the deformation block, or the substrate holder (or both) can be accomplished using a wafer prober, an aligner bonder, a hexapod, or any tool that allows precision movement and placement of semiconductor components. With a wafer prober, the deformation block can be configured for positioning at the non-functional components responsive to wafer mapping software.

The test system includes the deformation apparatus for deforming the resilient contact structures on the non functional components responsive to probe testing of the substrate. The test system also includes the substrate with the resilient contact structures on each functional component, and the deformed contact structures on each non functional component. The test system also includes a burn-in board, and a burn-in oven configured to burn-in test multiple substrates at the same time. In addition, the test system includes a test board having test pads configured to electrically engage the resilient contact structures on the functional components while maintaining a space between the deformed contact structures on the non functional components. The test pads on the test board are in electrical communication with test circuitry, and are biased into electrical engagement with the resilient contact structures using a pressure plate and a spring member.

An alternate embodiment test system includes a deformation block configured to electrically engage the resilient contact structures on each component, one component at a time, and to transmit test signals to the components to identify defective components. In addition, the deformation block is configured to deform the resilient contact structures on the defective components to provide electrical isolation during a subsequent burn-in test.

An alternate embodiment planarization system includes a deformation block configured to planarize the resilient contact structures on each component. In this embodiment the deformation block can be configured to just physically engage the resilient contact structures. Alternately the deformation block can be configured to physically and electrically engage the resilient contact structures, and to transmit test signal to the components.

BRIEF DESCRIPTION OF THE DRAWINGS

FIG. 8 is a schematic cross sectional view of an alternate embodiment test system constructed in accordance with the invention;

FIG. 8A is a cross sectional view taken along section line 8A—8A of FIG. 8;

FIGS. 9A–9C are schematic cross sectional views illustrating an alternate embodiment planarization system constructed in accordance with the invention.

DETAILED DESCRIPTION OF THE PREFERRED EMBODIMENTS

Figure 1:
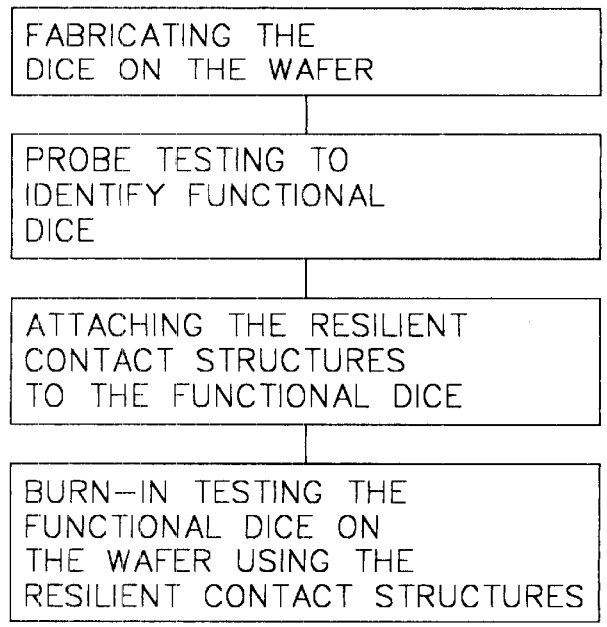
FIG. 1 is a flow diagram illustrating process steps in a prior art wafer level burn-in process.
Figure 2A:
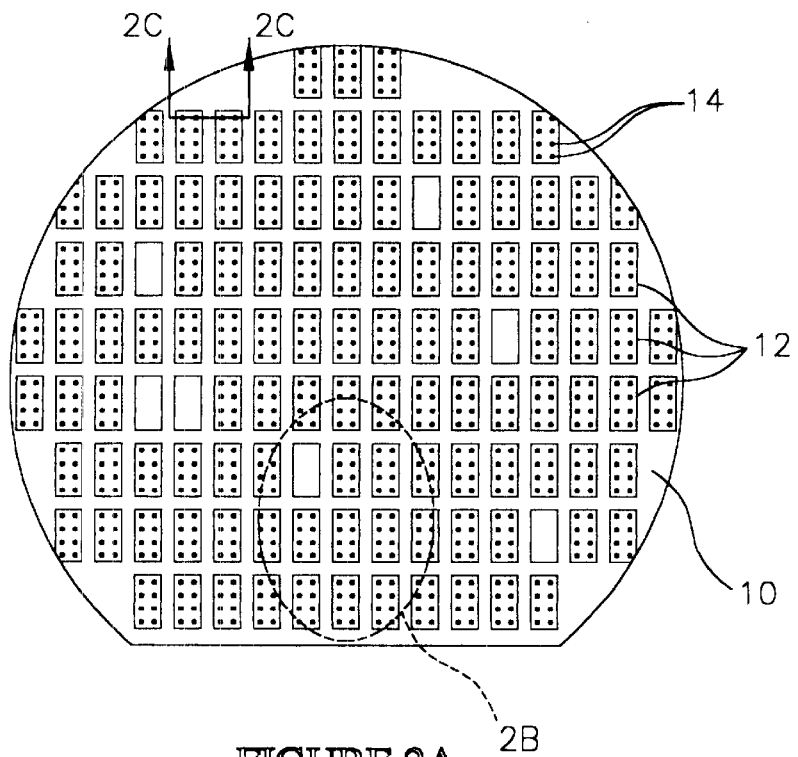
FIG. 2A is a schematic plan view of a prior art semiconductor wafer having semiconductor dice and resilient contact structures for performing the wafer level burn-in process.
Figure 2B:
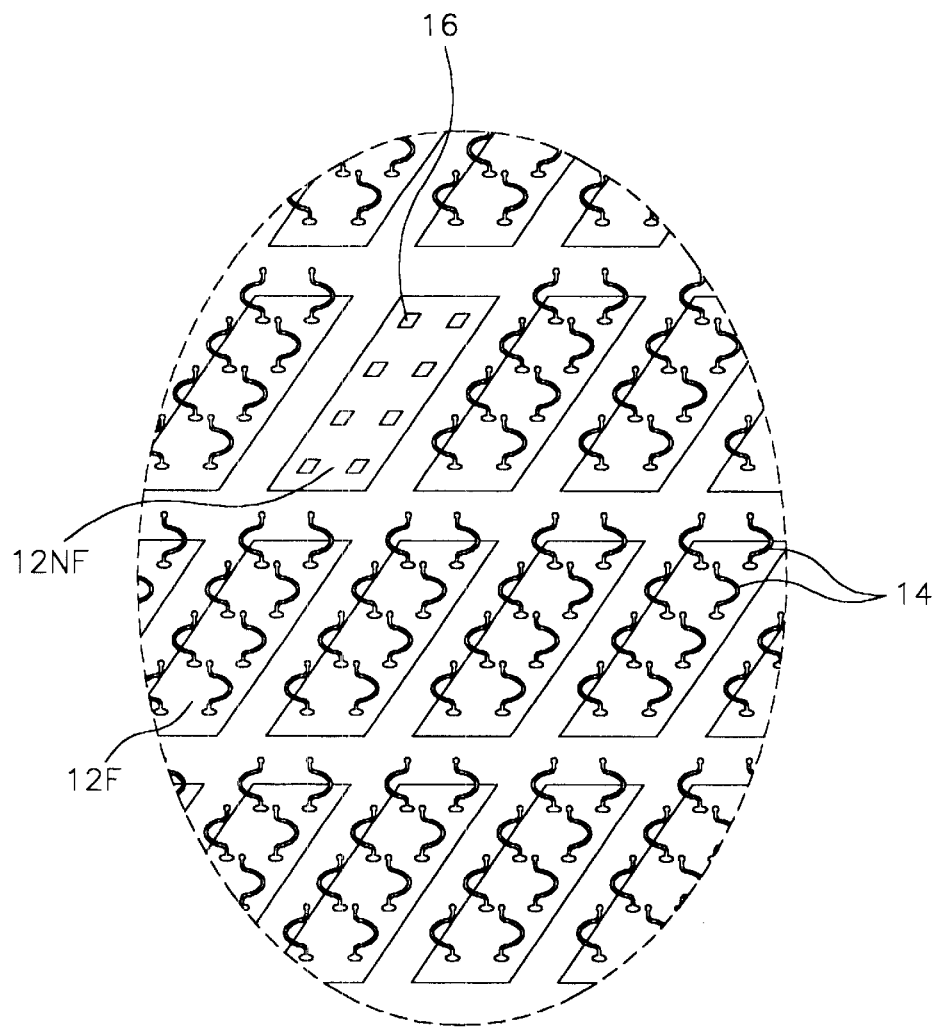
FIG. 2B is a schematic view taken along line 2B of FIG. 2A illustrating the resilient contact structures on the wafer.
Figure 2C:
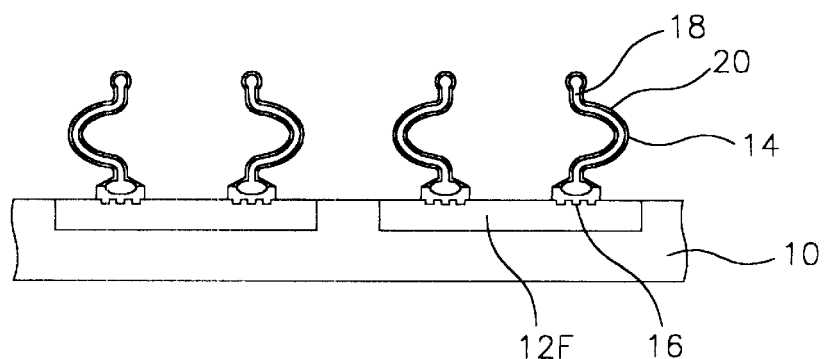
FIG. 2C is a cross sectional view taken along section line 2C—2C of FIG. 2A illustrating the resilient contact structures.
Figure 3A:
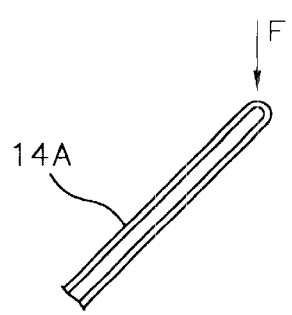
FIGS. 3A–3F are schematic cross sectional views illustrating various prior art resilient contact structures.
Figure 3B:
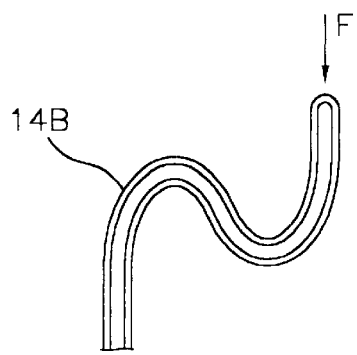
Figure 3C:
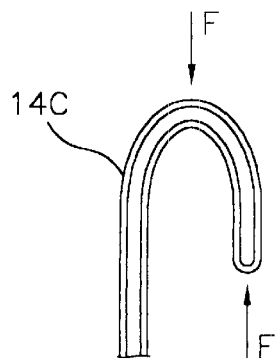
Figure 3D:
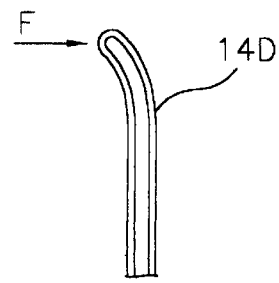
Figure 3E:
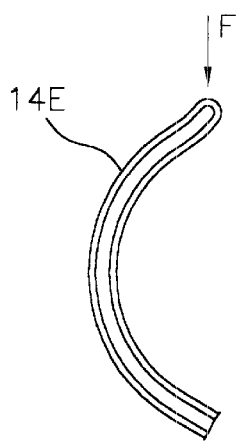
Figure 3F:
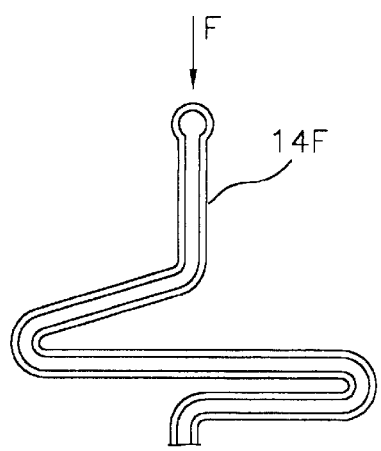
Figure 4:
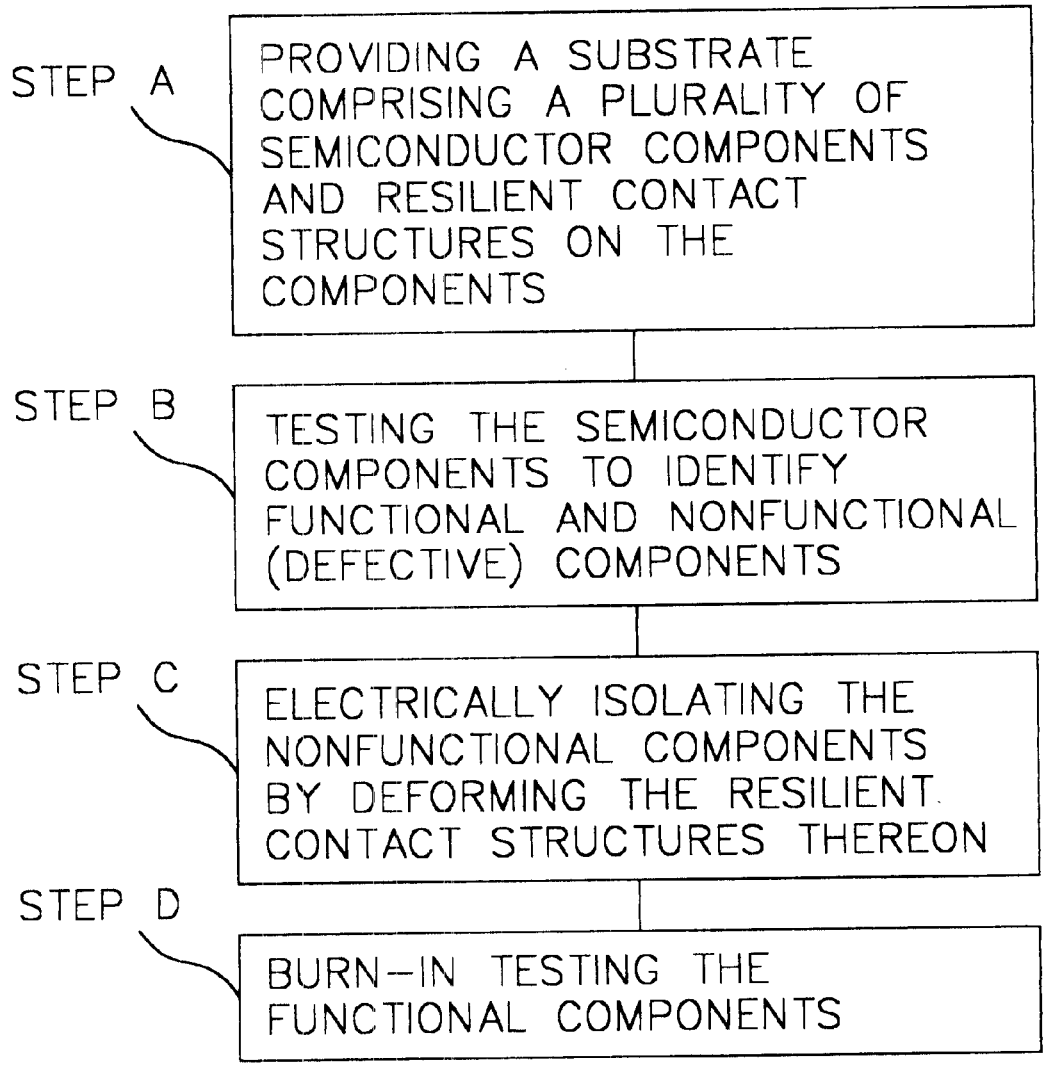
FIG. 4 is a flow diagram illustrating process steps in a method for testing and burning-in semiconductor components in accordance with the invention.

Referring to FIG. 4, a flow diagram illustrates steps in the method for testing and burning-in semiconductor components in accordance with the invention.

Step A. Providing a substrate comprising a plurality of semiconductor components and resilient contact structures on the components.

As used herein, the term "semiconductor component" refers to an electronic component that includes a semiconductor die. Exemplary semiconductor components include bare semiconductor dice, chip scale packages, ceramic or plastic semiconductor packages, BGA devices, and multi chip modules. In the illustrative embodiment the substrate comprises a semiconductor wafer and the semiconductor components comprise semiconductor dice contained on the wafer. Exemplary materials for the substrate include monocrystalline silicon, silicon-on-glass, silicon-on-sapphire, germanium and gallium arsenide. For other types of semiconductor components such as chip scale packages, the substrate can comprise a glass filled resin, such as FR-4, or a plastic, such as polyetherimide (PEI) or polyphenyl sulfide (PPS).

As used herein the term "contact structures" refers to terminal contacts in electrical communication with the integrated circuits contained on the semiconductor components. The term "resilient" refers to any shape that exhibits elastic movement responsive to a force applied to the contact structure. Exemplary "resilient contact structures" are illustrated in FIGS. 2C and 3A–3F.

Resilient contact structures are further described in the previously cited Eldridge et al. patents, and in U.S. Pat. No. 5,495,667 to Farnworth et al.

Step B. Testing the semiconductor components to identify functional, and non functional (defective) components.

This testing step can be performed using a conventional wafer prober for handling and electrically engaging the components on the substrate, and a tester for generating and applying test signals to the integrated circuits contained on the components. Suitable wafer probers are commercially available from Electroglass, as well as other manufacturers. Suitable testers are commercially available from Teradyne of Boston, Mass., as well as other manufacturers. Also, the wafer prober can include a test board with contact pads, rather than a conventional probe card with probe needles, to make temporary electrical connections with the resilient contact structures. Such a test board will be more fully hereinafter described.

Step C. Electrically isolating the non functional components by deforming the resilient contact structures thereon.

A deformation apparatus for deforming the resilient contact structure will be more fully hereinafter described.

Step D. Burn-in testing the functional components.

A system for performing burn-in testing will be more fully hereinafter described. During burn-in testing, the deformed contact structure on the non functional components provide electrical isolation, such that test signals are applied to only the functional components.

Figure 5A:
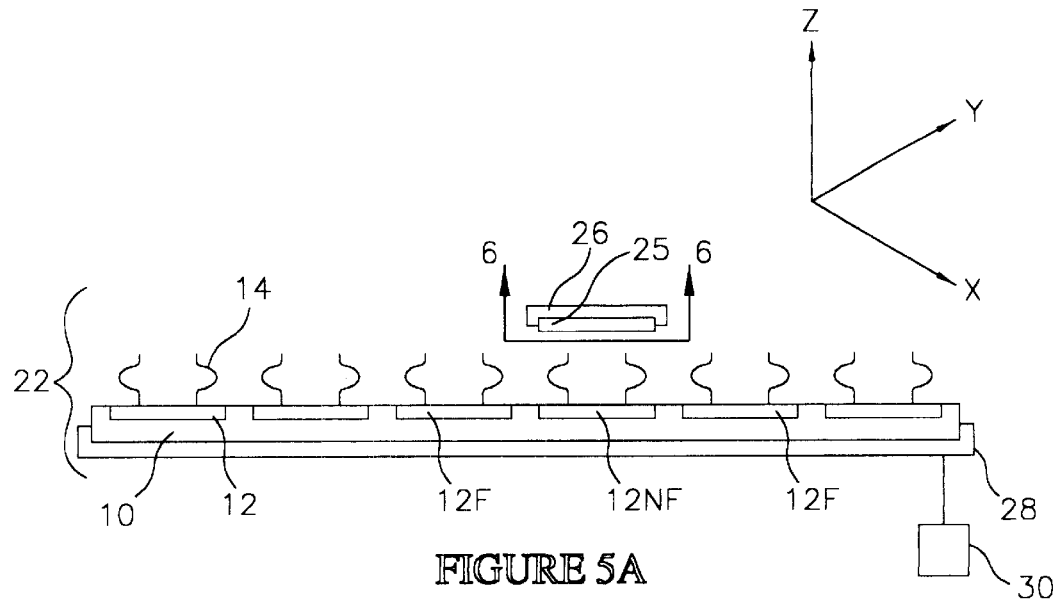
FIGS. 5A–5C are schematic cross sectional views illustrating steps in the method, and components of a system constructed to perform the method.
Figure 5B:
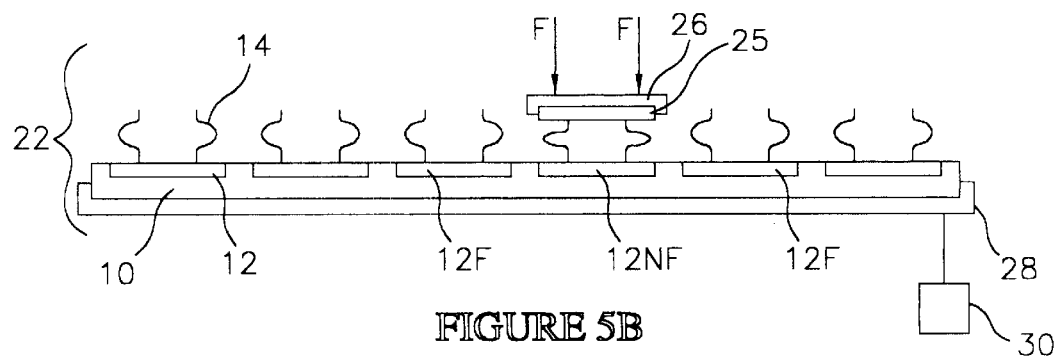
Figure 5C:
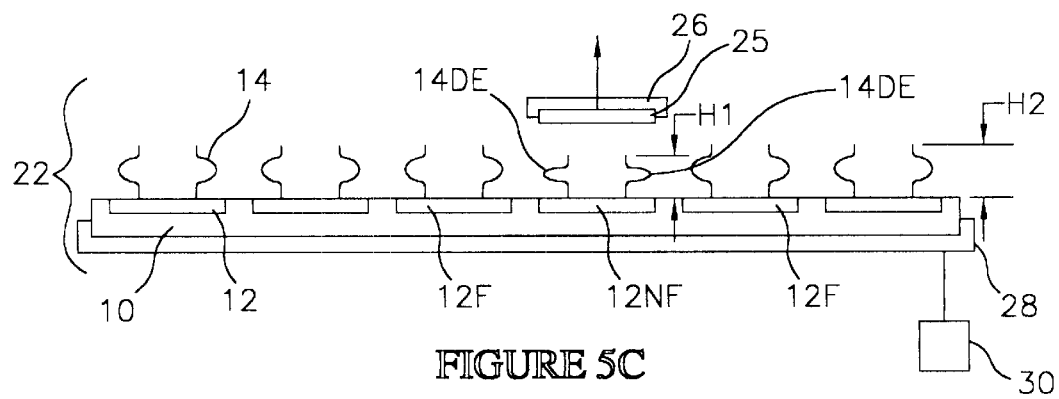

Referring to FIGS. 5A–5C, steps in the method of the invention are illustrated schematically. Initially, as shown in FIG. 5A, a semiconductor wafer 10 is provided. The wafer 10 includes a plurality of semiconductor dice 12 containing integrated circuits and various semiconductor devices. Each die 12 includes one or more patterns of resilient contact structures 14 in electrical communication with the integrated circuits and semiconductor devices contained on the die 12. The resilient contact structures 14 can be constructed substantially as previously described and shown in FIGS. 2C and 3A–3F. As also shown in FIG. 5A, the dice 12 have been tested to identify functional dice 12F and non-functional dice 12NF.

As also shown in FIG. 5A, in addition to the wafer 10 having the resilient contact structures 14 attached to all of the dice 12, a deformation apparatus 22 is provided. The deformation apparatus 22 is configured to deform one or more resilient contact structures 14 on the non-functional dice 12NF one die at a time, such that a subsequent burn-in test can be performed without electrically contacting the non-functional dice 12NF. The deformation apparatus 22 can be configured to deform all of the resilient contact structures 14 on each non-functional die 12NF. Alternately, the deformation apparatus 22 can be configured to deform selected resilient contact structures 14, such as power or ground connections on each non-functional die 12NF, leaving the remaining resilient contact structures 14, such as address/control/data connections, intact.

The deformation apparatus 22 includes a die-sized deformation block 25 configured to physically contact and deform one or more of the resilient contact structures 14 on the non-functional dice 12NF. The deformation apparatus 22 also includes a block holder 26 configured to hold the deformation block 25, and a wafer holder 28 configured to hold the wafer 10 during deformation of the resilient contact structures 14 by the deformation block 25.

Figure 6:
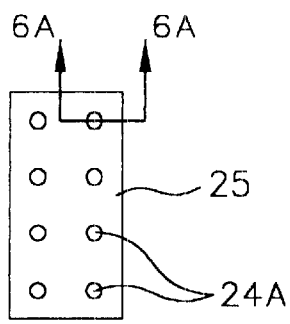
FIG. 6 is a plan view taken along section line 6—6 of FIG. 5A illustrating a deformation block of a deformation apparatus constructed in accordance with the invention.

As shown in FIG. 6, the deformation block 25 includes a plurality of retention structures 24A formed thereon. The retention structures 24A are formed in a pattern that exactly matches a pattern of the resilient contact structures 14 on an individual die 12. If only selected resilient contacts structures 14 on a die 12 are to be deformed, the retention structures 24A align with selected resilient contact structures 14 on the die 12 (e.g., power pins, ground pins).

Figure 6A:
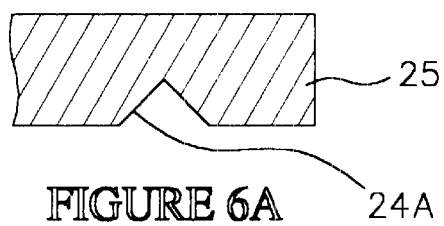
FIG. 6A is a cross sectional view taken along section line 6A—6A illustrating a retention structure on the deformation block.

As shown in FIG. 6A, the retention structures 24A comprise generally conical, v-shaped pockets or indentations, configured to retain and deform the resilient contact structures 14 on a single non-functional die 12NF. Preferably, the retention structures 24A are sized and shaped to facilitate compression, bending and shaping of the resilient contacts structures 14.

Figure 6C:
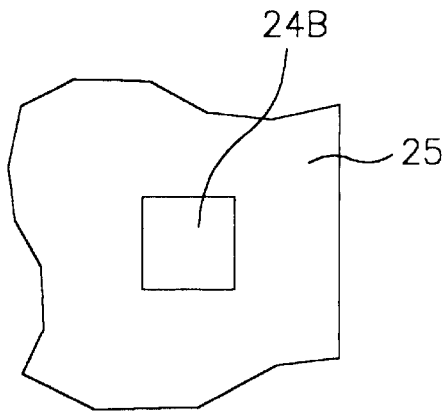
FIG. 6C is a plan view taken along section line 6C—6C of FIG. 6B of the alternate embodiment retention structure.
Figure 6B:
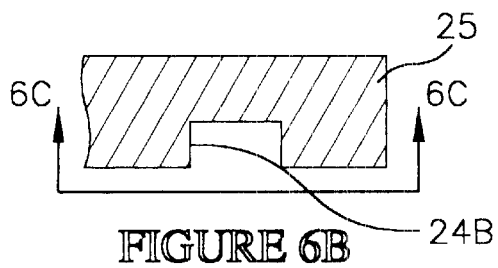
FIG. 6B is a cross sectional view equivalent to FIG. 6A illustrating an alternate embodiment retention structure.
Figure 6D:
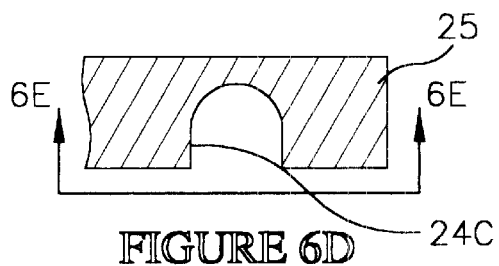
FIG. 6D is a cross sectional view equivalent to FIG. 6A illustrating another alternate embodiment retention structure.
Figure 6E:
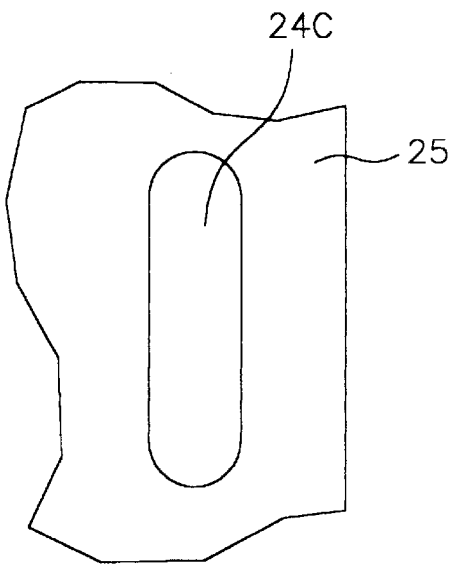
FIG. 6E is a plan view taken along section line 6E—6E of FIG. 6B of the alternate embodiment retention structure.
Figure 6F:
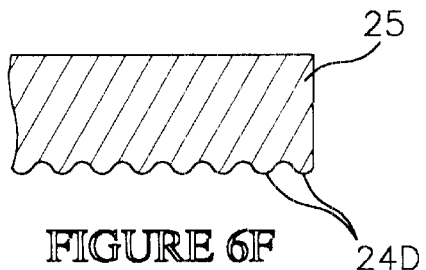
FIG. 6F is a cross sectional view equivalent to FIG. 6A illustrating another alternate embodiment retention structure.

Alternately, as shown in FIGS. 6B and 6C, retention structures 24B comprise pockets, or indentations in the deformation apparatus 22, having a generally square or rectangular peripheral configuration. Alternately, as shown in FIGS. 6D and 6E, retention structures 24C comprise elongated grooves configured to retain multiple resilient contact structures 14 at the same time. Alternately, as shown in FIG. 6F, retention structures 24D comprise a grooved, or rough surface on the deformation block 25. As is apparent to those skilled in the art, the above described embodiments of the retention structures 24A are exemplary and other configurations can be used.

Referring again to FIG. 5A, the block holder 26 and the wafer holder 28 are configured for X, Y and Z direction movement relative to one another, such that the retention structures 24 on the deformation block 25 can physically engage and deform the resilient contact structures 14 on the non-functional dice 12NF. As will be further explained, either the block holder 26 or the wafer holder 28 (or both) can be configured for movement in X, Y and Z directions.

In general, the block holder 26 and the wafer holder 28 can be mounted to any precision tool that permits accurate alignment of the retention structures 24 on the deformation block 25 with the resilient contact structures 14 on the non functional dice 12NF. In addition, the tool must be able to move either the block holder 26, or the wafer holder 28 (or both) in the Z direction to bring the deformation block 25 in physical contact with the resilient contact structures 14 on the non functional dice 12NF. Further, the tool must be able to move either the block holder 26 or the wafer holder 28 (or both) in X or Y directions such that the deformation block 25 can bend, compress, shape or otherwise deform the resilient contact structures 14.

For example, the block holder 26 and the wafer holder 28 can be mounted to an automated wafer testing apparatus such as wafer prober. In this case, a conventional wafer prober can be modified to include the block holder 26 and the deformation block 25 in place of a conventional probe card fixture and probe card. Further, movement of the wafer holder 28 or the block holder 26 can be controlled by a controller 30 as in a conventional wafer prober. In addition, the controller 30 can be programmed to use mapping information from the previous wafer level testing step, to locate the deformation block 25 at the non-functional dice 12NF.

As another example, the block holder 26 and the wafer holder 28 can be mounted to a manual tool such as an aligner bonder tool. Aligner bonder tools are commercially available from Research Devices of Piscataway, N.J., as well as other manufacturers. One suitable aligner bonder tool is described in U.S. Pat. No. 4,899,921 to Bendat et al. In this case viewing devices on the tool, rather than the controller 30, can be used to locate the deformation block 25 at the non functional die 12NF.

As another example, the block holder 26 and the wafer holder 28 can be mounted to a hexapod apparatus configured for moving either the deformation block 25, or the wafer 10 in six degrees of freedom. One suitable hexapod apparatus is described in U.S. Pat. No. 6,048,750 to Hembree.

Referring to FIG. 5B, movement of the block holder 26 or the wafer holder 28 (or both) in the Z-direction brings the deformation block 25 into physical contact with one or more of the resilient contact structures 14 on the non-functional dice 12NF. In addition, movement of the block holder 26 or the wafer holder 28 (or both) in the X-direction or the Y-direction compresses, bends, shapes, or otherwise deforms the resilient contact structures 14 on the non-functional dice 12NF to form deformed contact structures 14DE (FIG. 5C).

During the deformation step, the retention structures 24A on the deformation block 25 help to retain the resilient contact structures 14 as they are being deformed. In addition, the retention structures 24A can be constructed to shape or re-shape the resilient contact structures 14 during the deformation step. Preferably, the resilient contact structures 14 are compressed, bent or shaped with a force that exceeds the yield strength of the metal, or metals, which form the resilient contact structures 14. In addition, the deformation step must be performed to account for "spring back" of the deformed contact structures 14DE.

Referring to FIG. 5C, the deformed contact structures 14DE remain after the deformation block 25 is withdrawn. The deformed contact structures 14DE have a first height H1, that is less than a second height H2 of the remaining non-deformed resilient contact structures 14. The height differential can be on the order of several microns to several mils or more. As will be further explained, this height differential can be used to prevent electrical contact with the non-functional dice 12NF during a subsequent burn-in test.

Figure 7:
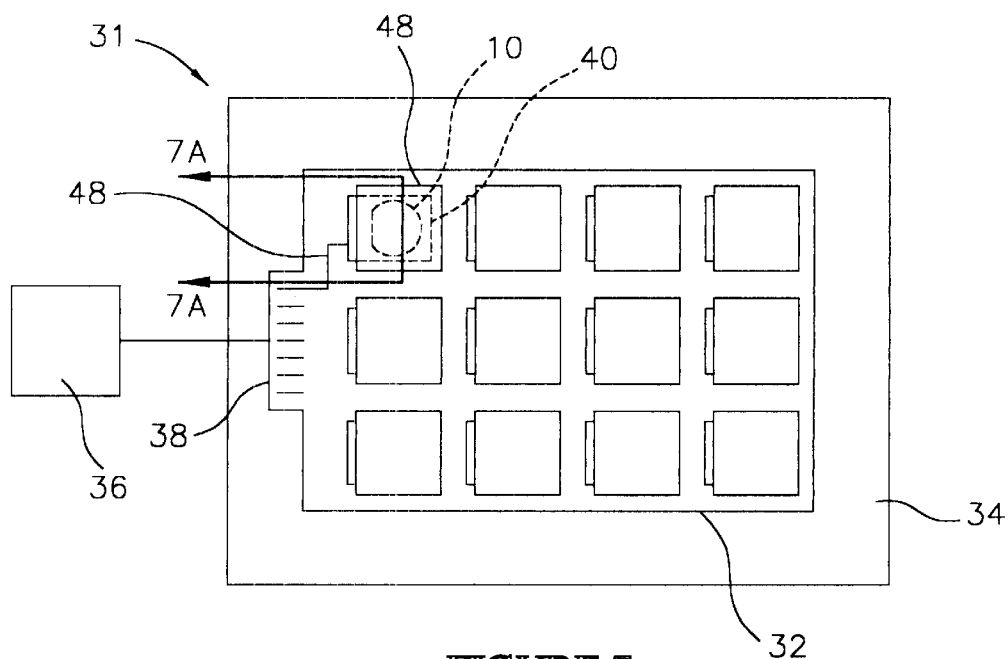
FIG. 7 is a schematic plan view of a test system constructed in accordance with the invention.
Figure 7A:
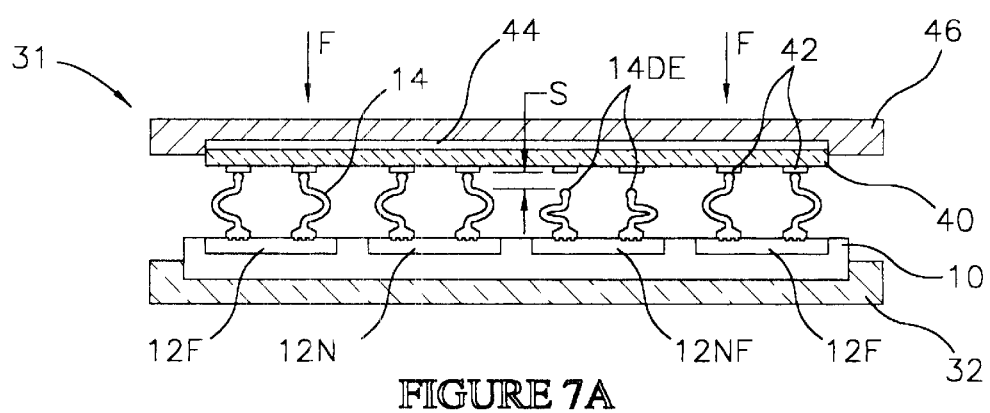
FIG. 7A is a cross sectional view taken along section line 7A—7A of FIG. 7 illustrating components of the test system.

Referring to FIGS. 7 and 7A, a test system 31 constructed in accordance with the invention is illustrated. The test system 31 includes the previously described deformation apparatus 22 (FIG. 5A). As shown in FIG. 7, the test system 31 includes a burn-in board 32, a burn-in oven 34 configured for retention in the burn-in oven 34, and test circuitry 36 in electrical communication with the burn-in board 32.

The burn-in board 32 is configured to retain multiple wafers 10 in the burn-in oven 34, while the test circuitry 36 electrically biases the integrated circuits contained on the dice 12. The burn-in oven 34 is configured to heat the wafers 10 to a temperature of at least 90° C., preferably between about 125° C. to 200° C., for between 8 to 168 hours, preferably between about 8 to 24 hours. Suitable burn-in ovens are manufactured by Micron Systems Integration under the trademark "AMBYX". The test circuitry 36 is configured to generate and apply test signals to the integrated circuits contained on the wafers 10. The burn-in board 32 includes an electrical connector 38 in electrical communication with the test circuitry 36.

As shown in FIG. 7A, the test system 31 also includes a test board 40 for transmitting the test signals from the test circuitry 36 to the integrated circuits, and a pressure plate 46 for biasing test pads 42 on the test board 40 into physical and electrical contact with the resilient contact structures 14 on the wafer 10. The test pads 42 are in electrical communication with conductors 48 (FIG. 7) on the burn-in board 32, which are in electrical communication with the electrical connector 38 and the test circuitry 36. The test board 40 can comprise a glass filled resin such as FR-4, and the test pads 42 can comprise a highly conductive metal, such as aluminum or copper. In addition, the test board 40 can include conductive traces and conductive vias (not shown), as is well known in the art, to establish electrical paths between the test pads 42 and the electrical connector 38 on the burn-in board 32. In addition to conducting the burn-in test, the test board 40, or one similar thereto, can be used to conduct the previous wafer probe test for identifying the functional dice 12F and non-functional dice 12NF.

The test system 31 also includes a spring member 44, which comprises an elastomeric polymer, such as silicone, that cushions a force F applied by the pressure plate 46 to the test board 40. The force F can be applied by any suitable mechanical element such as clips, fasteners, or weights. The burn-in board 32 is constructed to prevent movement of the wafer 10 as the biasing force F is applied through the test board 40 to the resilient contact structures 14.

As also shown in FIG. 7A, the test pads 42 on the test board 40 are configured to contact all of the resilient contact structures 14 on the wafer 10 at the same time. However, the deformed contact structures 14DE on the non-functional dice 12NF are shorter than the resilient contact structures 14 on the functional dice 12F. Accordingly, a space S is present between the deformed contact structures 14DE and the mating test pads 42 on the test board 40. The space S can be from microns to several mils or greater, and prevents electrical communication between the test circuitry 36 and the non-functional dice 12NF. This permits the test circuitry 36 to utilize "shared resources" to apply test signals to all of the functional dice 12F at the same time.

Referring to FIGS. 8 and 8A, an alternate embodiment test system 31A is illustrated. The test system 31A includes a deformation block 25A, a block holder 26A for holding the deformation block 25A, and a wafer holder 28A for holding the wafer 10. These elements are substantially equivalent to the corresponding elements which were previously described. However, in the test system 31A the deformation block 25A is configured to electrically engage the resilient contact structures 14 on each die 12, one die at a time, and to apply test signals to the integrated circuits contained on the dice 12. In addition, the deformation block 25A is configured to deform one or more of the resilient contact structures 14 on defective dice 12NF identified by the test signals. The deformed contact structures 14 (FIG. 7A) electrically isolate the defective dice 12NF (FIG. 7A) on the wafer 10 during a subsequent burn-in test as previously described.

The test system 31A also includes a wafer prober 58 configured to align and move the deformation block 25A and the wafer 10 into physical contact. The wafer prober 58 can comprise a conventional wafer probe, and the deformation block 25A can take the place of the probe card. However, the wafer prober 58 must also be configured to move the deformation block 25A, or the wafer 10, or both, to deform the resilient contact structures 14 as previously described.

As shown in FIG. 8A, the deformation block 25A also includes electrically conductive retention structures 24E having contact structures 52 configured to electrically engage the resilient contact structures 14 on the wafer 10. In the illustrative embodiment the electrically conductive retention structures 24E comprise conically shaped pockets as previously described, and the contact structures 52 comprise conductive layers in the pockets and metal filled vias in the deformation block 25A By way of example, the deformation block 25A can comprise an electrically insulating material, such as ceramic or plastic, and the contact structures 52 can be etched vias filled with a conductive material, such as metal or a conductive polymer. However, as is apparent to those skilled in the art, other arrangements are possible for retaining and electrically engaging the resilient contact structures 14.

In addition, electrical paths 54 on the block holder 26A, such as metal filled vias or signal traces, establish electrical communication with the contact structures 52. Additional electrical paths 56 on the wafer prober 58, such as "POGO PINS" or flex circuit, establish electrical communication with the test circuitry 36A.

In an exemplary test method conducted using the test system 31A, the deformation block 25A electrically engages the resilient contact structures 14 on each die 12, one die at a time. Test signals can then be applied to the integrated circuits and semiconductor devices on each die 12. If a die 12NF is determined to be defective, then the deformation block 25A can be moved as previously described, to deform the resilient contact structures 14, and electrically isolate the defective die 12NF for a subsequent wafer level burn-in test.

Referring to FIGS. 9A–9C, an alternate embodiment planarization system 31B configured to planarize the resilient contact structures 14 on each die 12, or the entire wafer 10, is illustrated. The planarization system 31B includes a deformation block 25B, and a block holder 26B configured to move the deformation block 25B in X, Y and Z directions. Alternately the deformation block 25B can be stationary and a wafer holder (not shown) can be configured to move the wafer 10 in X, Y and Z directions.

As shown in FIG. 9A, the resilient contact structures 14 on the wafer 10 can have variations in height making the resilient contact structures 14 on some dice 12 non-planar relative to one another. Stated differently, the Z-axis locations of the tip portions 18 of the resilient contact structures 14 can vary on a die 12.

As shown in FIG. 9B, the deformation block 25B is configured to physically engage the resilient contact structures 14 on one or more dice 12 (preferably all of the dice 12 on the wafer 10 at the same time), and to planarize the resilient contact structures 12 relative to one another by appropriate X, Y or Z direction movement of the deformation block 25B. As shown in FIG. 9C, following planarization, planarized contact structures 14P on each die 12 have a same height HP, such that the tip portions 18P thereof are located along a common plane P. Following singulation of the dice 12 from the wafer 10, the planarized contact structures 14P facilitate electrical mounting of the dice 12 to mating substrates such as PCBs. In the test system 31B, the deformation block 25B can also be configured to electrically engage and transmit test signal to the components substantially as previously described for deformation block 25A.

Thus the invention provides a method and a system for wafer level testing and burning-in semiconductor components such as semiconductor dice contained on a wafer. Also provided are a method and a system for planarizing resilient contact structures on semiconductor components. Although the invention has been described with reference to certain preferred embodiments, as will be apparent to those skilled in the art, certain changes and modifications can be made without departing from the scope of the invention, as defined by the following claims.

I claim:

1. A system for testing semiconductor components having a plurality of contact structures comprising:
    a substrate containing the components;
    a deformation apparatus comprising a controller programmed with test information on a location of at least one defective component on the substrate and a deformation block controlled by the controller configured to locate and deform the contact structures on the defective component;
    a test circuitry configured to generate test signals and to apply the test signals to the components; and
    a test board comprising a plurality of test pads in electrical communication with the test circuitry configured to electrically engage the contact structures on the components except the deformed contact structures on the at least one defective component.

2. The system of claim 1 wherein the contact structures comprise resilient contact structures.

3. The system of claim 1 wherein the deformation block is configured to move in X, Y and Z directions to locate the defective component.

4. The system of claim 1 wherein the substrate comprises a semiconductor wafer and the components comprise semiconductor dice or packages.

5. The system of claim 1 further comprising a deformation block configured to form the deformed contact structures by compression, bending or shaping thereof.

6. The system of claim 1 wherein the deformed contact structures have a first height and the contact structures have a second height which is greater than the first height.

7. A system for burn-in testing semiconductor dice having a plurality of resilient contact structures on a wafer comprising:
    a deformation apparatus comprising a holder for holding the wafer and a block configured to locate defective dice on the wafer and to deform the resilient contact structures on the defective dice by compression, bending or shaping thereof;
    a test circuitry configured to generate test signals and to apply the test signals to the dice;
    a burn-in board configured to retain the wafer in electrical communication with the test circuitry; and
    a test board on the burn-in board comprising a plurality of test pads in electrical communication with the test circuitry configured to electrically engage the resilient contact structures on the dice while maintaining a spacing between the resilient contact structures on the defective dice.

8. The system of claim 7 further comprising a pressure plate configured to bias the test board and the wafer together.

9. The system of claim 7 further comprising a controller configured to use test information from testing of the wafer to move the deformation apparatus to locate the defective dice.

10. The system of claim 7 further comprising a controller configured to store test information on a location of the defective dice and to move the deformation block responsive to the information.

11. The system of claim 7 wherein the block comprises a plurality of retention structures for retaining the resilient contact structures.

12. A system for burn-in testing semiconductor dice having a plurality of resilient contact structures on a substrate comprising:
- a controller configured to store test information on a location of defective dice on the substrate;
- a deformation block configured for positioning by the controller proximate to the defective dice and movable to compress, bend or shape the resilient contact structures on the defective dice into deformed contact structures;
- a burn-in oven configured to heat the substrate to a selected temperature;
- a burn-in board configured to retain the substrate in the burn-in oven;
- a test circuitry configured to apply test signals to the dice; and
- a test board on the burn-in board comprising a plurality of pads in electrical communication with the test circuitry configured to electrically engage the resilient contact structures on the dice while the deformed contact structures electrically isolate the defective dice from the pads.

13. The system of claim 12 wherein the deformation block is movable in X, Y and Z directions.

14. The system of claim 12 wherein the deformation block comprises a plurality of retention structures configured to retain the resilient contact structures.

15. A system for burn-in testing semiconductor components having a plurality of resilient contact structures on a substrate comprising:
- a deformation apparatus configured to deform the resilient contact structures on defective components responsive to testing to form deformed contact structures;
- a burn-in board configured to retain the substrate;
- a test circuitry configured to apply test signals to the components; and
- a test board on the burn-in board in electrical communication with the test circuitry configured to electrically engage the contact structures but not the deformed contact structures.

16. The system of claim 15 further comprising a burn-in oven configured to retain the burn-in board and to heat the substrate to a selected temperature.

17. The system of claim 15 wherein the resilient contact structures comprise spring segments.

18. The system of claim 15 wherein the deformed contact structures have a first height and the resilient contact structures have a second height greater than the first height.

19. The system of claim 15 further comprising a controller configured to store test information on the component and to control the deformation apparatus to locate the defective dice.

20. The system of claim 15 wherein the deformation apparatus comprises a holder for the substrate and a block movable to form the deformed contact structures.

21. A system for burn-in testing semiconductor dice having a plurality of resilient contact structures on a wafer comprising:
- a controller configured to store test information on a location of at least one defective die on the-wafer;
- a deformation apparatus comprising a holder for the wafer and a block movable to deform the resilient contact structures on the at least one defective die responsive to the controller to provide deformed contact structures;
- a test circuitry configured to generate test signals and to apply the test signals to the dice; and
- a burn-in board configured to retain the wafer in electrical communication with the test circuitry while the deformed contact structures electrically isolate the at least one defective die from the test circuitry.

22. The system of claim 21 wherein the block comprises a plurality of retention structures configured to engage the resilient contact structures on the at least one defective die.

23. The system of claim 21 further comprising a test board on the burn-in board comprising a plurality of test pads in electrical communication with the test circuitry configured to electrically engage the contact structures while maintaining a spacing with the deformed contact structures.

24. The system of claim 21 wherein the block is movable to compress, bend or shape the resilient contact structures on the at least one defective die to provide the deformed contact structures.

25. The system of claim 21 wherein the block is movable to compress, bend or shape the resilient contact structures and comprises a plurality of retention structures configured to retain the resilient contact structures during compression, bending or shaping thereof.

* * * * *